United States Patent
Boeve et al.

(10) Patent No.: US 7,804,165 B2
(45) Date of Patent: Sep. 28, 2010

(54) DEVICE COMPRISING A SENSOR MODULE

(75) Inventors: Hans M. B. Boeve, Hechtel-Eksel (BE);
Teunis J. Ikkink, Geldrop (NL);
Nicolaas J. A. Van Veen, Geldrop (NL)

(73) Assignee: NXP B.V., Eindhoven (NL)

( * ) Notice: Subject to any disclaimer, the term of this patent is extended or adjusted under 35 U.S.C. 154(b) by 83 days.

(21) Appl. No.: 11/913,585

(22) PCT Filed: Apr. 27, 2006

(86) PCT No.: PCT/IB2006/051313

§ 371 (c)(1),
(2), (4) Date: Oct. 24, 2008

(87) PCT Pub. No.: WO2006/117727

PCT Pub. Date: Nov. 9, 2006

(65) Prior Publication Data

US 2009/0166771 A1   Jul. 2, 2009

(30) Foreign Application Priority Data

May 4, 2005   (EP) .................................. 05103724

(51) Int. Cl.
*H01L 23/12* (2006.01)
(52) U.S. Cl. ............... 257/686; 257/685; 257/E23.021; 257/E23.023
(58) Field of Classification Search ................ 257/685, 257/686, E23.021, E23.023, 80, E33.076
See application file for complete search history.

(56) References Cited

U.S. PATENT DOCUMENTS

| | | | |
|---|---|---|---|
| 5,365,088 A | 11/1994 | Myrosznyk et al. | |
| 5,424,573 A | 6/1995 | Kato et al. | |
| 5,574,285 A | 11/1996 | Marion et al. | |
| 5,729,896 A | 3/1998 | Dalal et al. | |
| 6,486,545 B1 * | 11/2002 | Glenn et al. | 257/686 |
| 6,608,371 B2 * | 8/2003 | Kurashima et al. | 257/686 |
| 6,765,287 B1 * | 7/2004 | Lin | 257/686 |
| 6,828,545 B1 | 12/2004 | Hamilton, Jr. et al. | |
| 6,836,971 B1 | 1/2005 | Wan | |
| 7,102,238 B2 * | 9/2006 | Noma et al. | 257/777 |

(Continued)

FOREIGN PATENT DOCUMENTS

CN   1181619 A   5/1997

*Primary Examiner*—Allan R Wilson

(57) ABSTRACT

A device (1) comprising a sensor module (2) with a package (3) is produced at reduced costs by providing the package (3) with two or more substrates (4,5) each with a functional layer (14,15), at least one sensor (24,25) such as a magnetometer and/or an accelerometer being located in at least one functional layer (14,15), and by providing the package (3) with a system comprising solder bumps (7-12) for aligning the functional layers (14,15). The system either comprises a first number of solder bumps (7,8) for coupling the functional layers (14,15) electrically and mechanically to each other via first bonding elements (31) or comprises a third substrate (6) with a third functional layer (16) and a second number of solder bumps (9,10) for coupling the first and third functional layers (14,16) electrically and mechanically to each other via second bonding elements (32) and a third number of solder bumps (11,12) for coupling the second and third functional layers (15,16) electrically and mechanically to each other via third bonding elements (33). Mechanically and/or electrically dummy solder bumps improve the alignment of the functional layers (14,15).

20 Claims, 3 Drawing Sheets

U.S. PATENT DOCUMENTS

| | | | |
|---|---|---|---|
| 7,167,373 B1 * | 1/2007 | Hoang et al. | 361/749 |
| 7,265,430 B2 * | 9/2007 | Naito et al. | 257/421 |
| 7,268,435 B2 * | 9/2007 | Ohta | 257/777 |
| 2002/0017710 A1 * | 2/2002 | Kurashima et al. | 257/686 |
| 2003/0230797 A1 * | 12/2003 | Mashino | 257/686 |
| 2005/0230827 A1 * | 10/2005 | Naito et al. | 257/737 |
| 2006/0108676 A1 * | 5/2006 | Punzalan et al. | 257/686 |
| 2007/0284684 A1 * | 12/2007 | Naito et al. | 257/421 |

* cited by examiner

DEVICE COMPRISING A SENSOR MODULE

FIELD

The invention relates to a device comprising a sensor module, and also relates to a sensor module, and to methods for producing a sensor module and a device.

DESCRIPTION OF THE RELATED ART

Examples of such a device are portable pc's and small handheld electronic devices, such as mobile phones, personal digital assistants, digital camera's and global positioning systems, and larger transport devices, such as aircrafts, cars, boats motorbikes, scooters, mopeds and bikes. Examples of such a sensor module are sensor modules for measuring magnetical fields, electrical fields and gravitational fields.

A prior art device is known from U.S. Pat. No. 6,836,971 B1, which discloses a system with a sensor module comprising a first sensor (a tilt sensor) and a second sensor (a magnetic sensor).

According to a first option, the first and second sensors are produced separately from each other. Thereto, a first substrate with a first functional layer comprising the first sensor is located into a first package, and a second substrate with a second functional layer comprising the second sensor is located into a second package. Later on, both packages are coupled to each other, e.g. by mounting them on a same printed circuit board. This process step leads to a certain tolerance in the positioning and orientation of both packages. Therefore, this first option can be an expensive option owing to the fact that the two separate sensors may require two functionally different calibrations. It is to be noted that the device cost comprises the manufacturing cost, the packaging cost and the test and calibration costs. The total costs of two separate calibrations make the prior art device relatively expensive.

According to a second option, the first and second sensors are produced together. Thereto, several possibilities exist here. Two separate dies comprising the two separate sensors can be combined on a common lead frame, which leads to tolerances in the positioning and orientation of both dies. Alternatively, CMOS backend integration or post-processing processes can be used to combine the sensor functions. CMOS backend integration is very difficult for certain types of sensors, such as magneto resistive sensors, e.g. due to non-compatibility of materials or processes. Therefore, this option is further an expensive option. The alternative using post-processing (as well as CMOS backend integration) is further an expensive option owing to the fact that generally a larger initial substrate area is required due to a larger required functional area. The difficult and complex processes and the larger initial substrate area with the larger functional area make the prior art devices relatively expensive during manufacturing.

The known device is disadvantageous, inter alia, owing to the fact that it is relatively expensive.

BRIEF SUMMARY

It is an object of the invention, inter alia, to provide a relatively low cost device comprising a relatively low cost sensor module.

Further objects of the invention are, inter alia, to provide a relatively low cost sensor module, and methods for producing a relatively low cost sensor module and a relatively low cost device.

The device according to the invention comprises a sensor module, the sensor module comprising a package, the package comprising:

a first substrate with a first functional layer, a second substrate with a second functional layer, at least one sensor located in at least one of the functional layers, and a system comprising solder bumps for aligning the first and second functional layers.

By providing the device according to the invention with a sensor module comprising two separate substrates, with each substrate comprising its own functional layer, and with at least one sensor being located in at least one functional layer, and by introducing a system of solder bumps for aligning the functional layers, whereby the combination of the two substrates is located inside one package, a relatively low cost device comprising a relatively low cost sensor module has been created.

By giving the solder bumps, for example in addition to their electrically coupling function and/or their mechanically coupling function, an aligning function, the calibration procedure can be simplified in the sense that, during the calibration procedure of the device, a single, common coordinate frame can be assumed for one or more sensors in a sensor module. The aligning function is based on the fact that nowadays solder bumps can be produced with small tolerances.

The device according to the invention is further advantageous, inter alia, in that, compared to using two separate packages, one package is saved, and in that, compared to common lead frame constructions and post-processing constructions, a cost-effective solution is obtained.

The at least one sensor that is located in at least one of the functional layers comprises the options of one sensor being entirely located in the first functional layer, of one sensor being entirely located in the second functional layer, of one sensor being partly located in the first functional layer and partly located in the second functional layer, of two sensors being together located in one of the functional layers, and of two sensors being separately located in different functional layers, without excluding further options.

The sensor module may comprise one or more further packages, the package may comprise one or more further substrates, the first and second substrates may each comprise further functional layers, the first and second functional layers may each comprise further sensors, and the solder bumps may have further functions than aligning the first and second functional layers, without departing from the scope of this invention.

An embodiment of the device according to the invention is defined by the system comprising a first number of solder bumps for coupling the functional layers electrically and mechanically to each other via first bonding elements. In this case, for example, the first functional layer is located under the first substrate, the second thin film is located on the second substrate, and per solder bump a pair of first bonding elements is located under the first functional layer and on the second functional layer, with the solder bump being coupled to this pair of first bonding elements.

An embodiment of the device according to the invention is defined by the first number of solder bumps being larger than a number of corners of the first or second substrate. Usually, the first and second substrates are square or rectangular substrates having four corners. Then, for realizing mechanical stability, four solder bumps would need to be used between the first and second functional layers. By using a first number equal to five or more, in other words by introducing mechanically dummy solder bumps, a better alignment of the functional layers will be achieved.

An embodiment of the device according to the invention is defined by the first number of solder bumps being larger than a number of different first electrical signals to be exchanged between the first and second functional layers. Usually, the number of different first electrical signals to be exchanged between the first and second functional layers comprises a ground signal, a supply signal and one or more electrical sensor signals. Then, for realizing electrical communication, this number of solder bumps would need to be used between the first and second functional layers. By using a first number larger than this number, in other words by introducing electrically dummy solder bumps, a better alignment of the functional layers will be achieved.

An embodiment of the device according to the invention is defined by the system comprising a third substrate with a third functional layer and a second number of solder bumps for coupling the first and third functional layers electrically and mechanically to each other via second bonding elements and a third number of solder bumps for coupling the second and third functional layers electrically and mechanically to each other via third bonding elements. In this case, for example, the first functional layer is located under the first substrate, the second functional layer is located under the second substrate, the third functional layer is located on the third substrate, and a pair of second bonding elements is located under the first functional layer and on the third functional layer, with a solder bump being coupled to this pair of second bonding elements, and a pair of third bonding elements is located under the second functional layer and on the third functional layer, with a solder bump being coupled to this pair of third bonding elements.

An embodiment of the device according to the invention is defined by the second number of solder bumps being larger than a number of corners of the first substrate and the third number of solder bumps being larger than a number of corners of the second substrate. By introducing mechanically dummy solder bumps, a better alignment of the functional layers will be achieved.

An embodiment of the device according to the invention is defined by the second number of solder bumps being larger than a number of different second electrical signals to be exchanged between the first and third functional layers and the third number of solder bumps being larger than a number of different third electrical signals to be exchanged between the second and third functional layers. By introducing electrically dummy solder bumps, a better alignment of the functional layers will be achieved.

An embodiment of the device according to the invention is defined by the at least one sensor comprising a magnetometer.

An embodiment of the device according to the invention is defined by the at least one sensor comprising at least a one-dimensional sensor for sensing a field in at least one direction.

An embodiment of the device according to the invention is defined by the at least one sensor comprising a first sensor comprising a magnetometer and a second sensor comprising another magnetometer.

An embodiment of the device according to the invention is defined by the at least one sensor comprising a first sensor comprising an at least one-dimensional sensor for sensing a field in at least one direction and a second sensor comprising an at least one-dimensional sensor for sensing a field in at least one direction.

An embodiment of the device according to the invention is defined by the first sensor comprising a magnetometer and the second sensor comprising an accelerometer. For this combination of sensors, the invention is very advantageous, without excluding further combinations.

An embodiment of the device according to the invention is defined by the at least one sensor comprising a first sensor comprising an at least two-dimensional sensor for sensing a field in at least two directions and a second sensor comprising an at least two-dimensional sensor for sensing a field in at least two directions. For this combination of sensors, the invention is very advantageous, without excluding further combinations.

An embodiment of the device according to the invention is defined by at least one functional layer comprising circuitry for processing electrical sensor signals originating from the at least one sensor. The first functional layer and/or the second functional layer and/or the third functional layer might comprise such circuitry to increase the area efficiency of the functional layers. The processing of the electrical sensor signals might comprise analog-to-digital conversions and/or temperature compensations and/or amplifications and/or calculations, without excluding further processing.

Embodiments of the sensor module according to the invention and of the methods according to the invention correspond with the embodiments of the device according to the invention.

The invention is based upon an insight, inter alia, that separate calibrations and/or difficult and complex processes make the prior art devices relatively expensive, and is based upon a basic idea, inter alia, that the sensor module should comprise a package with two or more substrates, each substrate with a functional layer, at least one functional layer comprising at least one sensor, whereby solder bumps are to be used for aligning the functional layers.

The invention solves the problem, inter alia, to provide a cost-effective and compact device comprising a cost-effective and compact sensor module, and is further advantageous, inter alia, in that, compared to using two separate packages, one package is saved, and in that, compared to common lead frame constructions and post-processing constructions, a cost-effective solution is obtained.

These and other aspects of the invention will be apparent from and elucidated with reference to the embodiments(s) described hereinafter.

BRIEF DESCRIPTION

DETAILED DESCRIPTION

Figure 1:
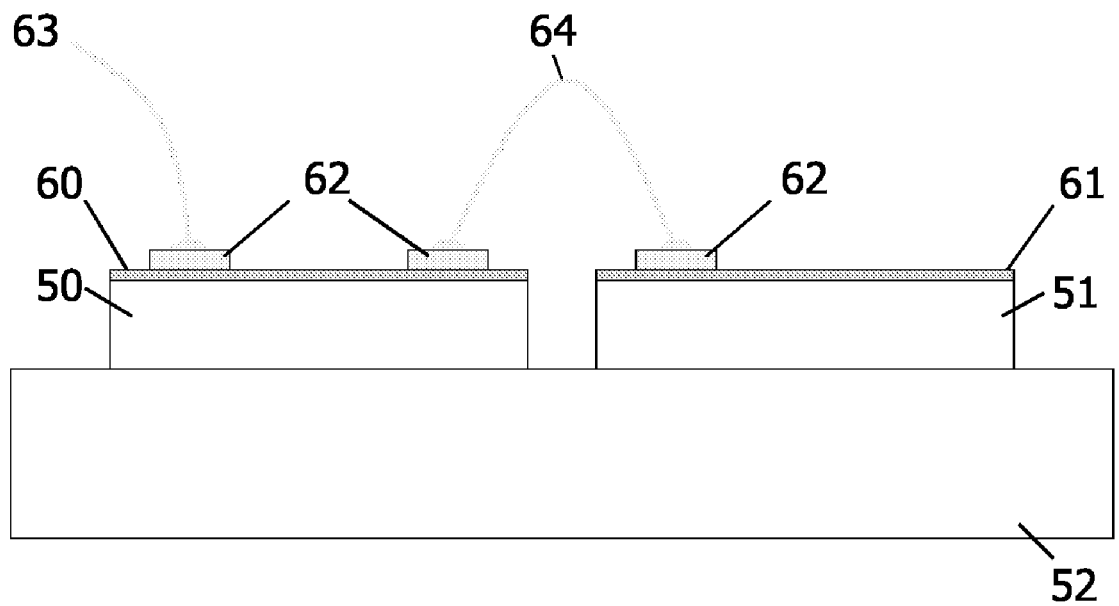
FIG. 1 shows a first embodiment of a prior art sensor module in cross section.

The first embodiment of the prior art sensor module shown in FIG. 1 in cross section comprises a first substrate 50 with a first functional layer 60 and comprises a second substrate 51 with a second functional layer 61. At least one of the functional layers 60,61 is comprising a sensor not shown. Both substrates are located on a common lead frame 52. Bonding elements 62 on the functional layers 60,61 are coupled to a wire 63 for allowing communication with other circuitry not shown and are coupled to a wire 64 for allowing communication between the functional layers 60,61.

Figure 2:
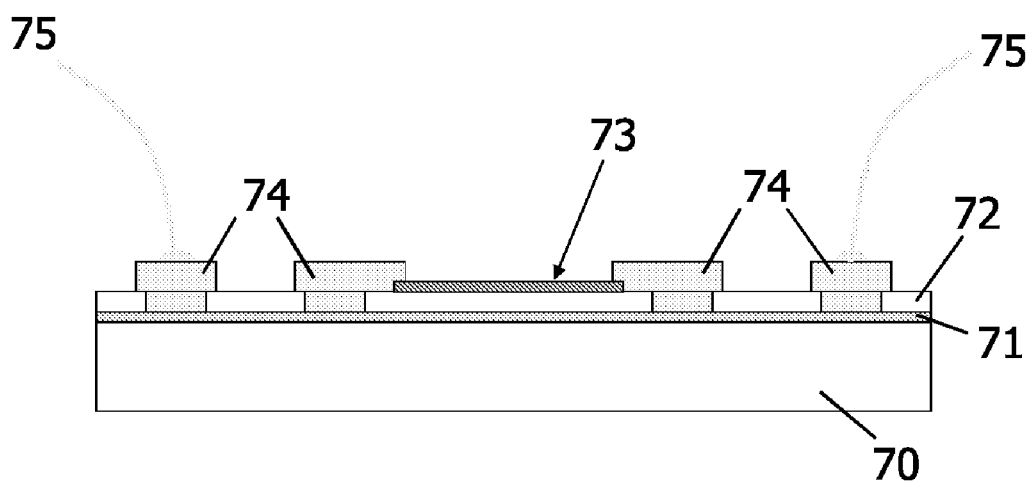
FIG. 2 shows a second embodiment of a prior art sensor module in cross section.

The second embodiment of the prior art sensor module shown in FIG. 2 in cross section comprises a substrate 70 with a functional layer 71. Through a post-processing process, an additional layer 72 is located on the functional layer 71. In FIG. 2 an example is given of a sensor 73 that is located on the additional layer 72. Bonding elements 74 on the functional layer 71 and through the additional layer 72 are coupled to the sensor 73 for allowing communication between the first functional layer 71 and the sensor 73 and are coupled to wires 75 for allowing communication with circuitry not shown here.

To produce a sensor module comprising at least one sensor in line with the FIGS. 1 and 2, either relatively large modules are obtained, or difficult and complex processes are to be used. The latter processes are relatively expensive processes, and as a result, these prior art sensor modules are relatively expensive modules.

According to the invention, a cost-effective, compact device comprising a cost-effective, compact sensor module is provided. Two embodiments of such cost-effective sensor modules are shown in FIGS. 3 and 4.

Figure 3:
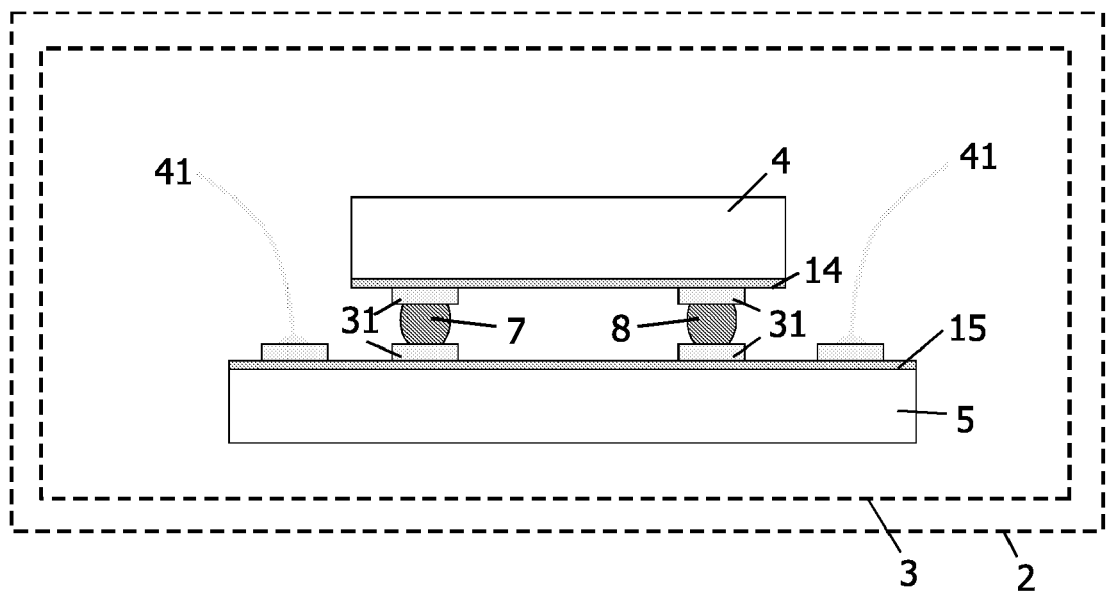
FIG. 3 shows a first embodiment of a sensor module according to the invention in cross section.
Figure 4:
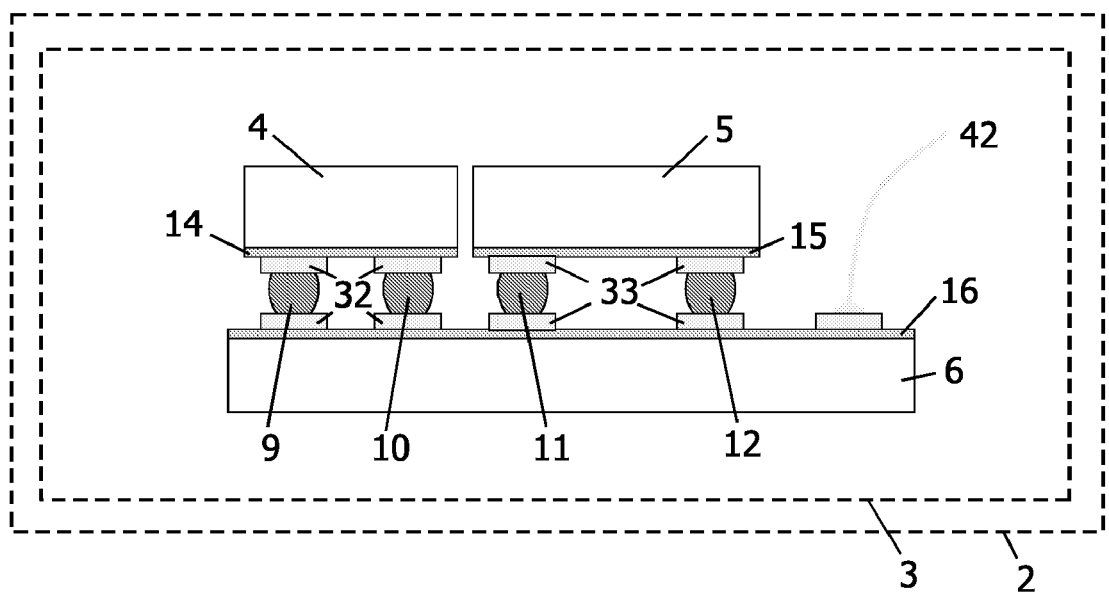
FIG. 4 shows a second embodiment of a sensor module according to the invention in cross section.

The first embodiment of the sensor module according to the invention shown in FIG. 3 in cross section (first option) discloses a sensor module 2 comprising a package 3. The package 3 comprises a first substrate 4 with a first functional layer 14. The package 3 comprises a second substrate 5 with a second functional layer 15. One of the functional layers 14,15 comprises a sensor not shown whereas the other functional layer 14,15 comprises active silicon in the sense that it provides an application specific integrated circuit (ASIC) function. A first number of solder bumps 7,8 is coupled to both functional layers 14,15 via first bonding elements 31. Other bonding elements are coupled to wires 41 for allowing communication with circuitry not shown here.

A method for monolithic integration of a functional layer comprising an at least one-dimensional sensor for sensing a field in at least one direction with an ASIC that serves as signal conditioning and processing unit for the sensor is disclosed. The sensor substrate can serve as relatively low cost support substrate for the sensor module. Simple discrete devices such as resistors, capacitors or inductors can be integrated within the support substrate. The approach is ideally suited for integrated magnetic sensors based on magneto resistance effects, i.e. anisotropic magneto resistive (AMR) and giant magneto resistive (GMR) sensors. Extra test-pads to the sensor may be provided for the purposes of testing and magnetic initialization during manufacturing. The function of the ASIC includes signal conditioning (e.g. amplification, temperature and field compensation, offset cancellation) and signal processing including analog-digital conversion. Field compensation and set/reset flipping techniques are often implemented for magnetic sensors.

The first embodiment of the sensor module according to the invention shown in FIG. 3 in cross section (second option) discloses a sensor module 2 comprising a package 3. The package 3 comprises a first substrate 4 with a first functional layer 14 comprising a first sensor 24 not shown here but shown below in FIGS. 5 and 6. The package 3 comprises a second substrate 5 with a second functional layer 15 comprising a second sensor 25 not shown here but shown below in FIGS. 5 and 6. A first number of solder bumps 7,8 is coupled to both functional layers 14,15 via first bonding elements 31. Other bonding elements are coupled to wires 41 for allowing communication with circuitry not shown here but shown below in FIGS. 5 and 6.

The second embodiment of the sensor module according to the invention shown in FIG. 4 in cross section discloses a sensor module 2 comprising a package 3. The package 3 comprises a first substrate 4 with a first functional layer 14 comprising a first sensor 24 not shown here but shown below in FIGS. 5 and 6. The package 3 comprises a second substrate 5 with a second functional layer 15 comprising a second sensor 25 not shown here but shown below in FIGS. 5 and 6. The package 3 comprises a third substrate 6 with a third functional layer 16. A second number of solder bumps 9,10 is coupled to the first and third functional layers 14,16 via second bonding elements 32. A third number of solder bumps 11,12 is coupled to the second and third functional layers 15,16 via third bonding elements 33. An other bonding element is coupled to a wire 42 for allowing communication with circuitry not shown here but shown below in FIGS. 5 and 6.

The use of solder bumps 7-12 is a low complex and therefore cost-effective technology. Moreover, it allows further miniaturization of sensor modules. Generally, the solder bumps 7-12 align the first and second functional layers 14,15. More particularly, the solder bumps 7,8 align the first and second functional layers 14,15 directly, and the solder bumps 9-12 align the first and second functional layers 14,15 indirectly via the third functional layer 16. By giving these solder bumps 7-12, for example in addition to their electrically coupling function and/or their mechanically coupling function, an aligning function, only one calibration will need to be performed for calibrating the two sensors. As a result, the sensor module 2 according to the invention is relatively low cost. The aligning function is based on the fact that nowadays solder bumps can be produced with small tolerances.

In the case of two substrates, the two functional layers are provided with opposite, solderable interconnect pads. One of the substrates is provided with solderable bumps, which, preferably, are made of a solder with high surface tension, e.g. such as the solders which contain a high Sn content. In the reflow process a connection is made between the two substrates, which initially may be poorly aligned. In the reflow process, due to minimization of free energy, the free surface of the bump is minimized; provide the proper process conditions are provided, leading to accurate alignment of the substrates. Calculation examples show that even sub-micron accuracy can be achieved, when using a fair number of bumps. The alignment is not only reached for the displacement in the XY plane, but also for the rotation in the XY plane and the out-of-plane rotation.

The first number of solder bumps 7,8 is preferably larger than a number of corners of the first or second substrate 4,5. Usually, the first and second substrates 4,5 are square or rectangular substrates having four corners. Then, for realizing mechanical stability, four solder bumps would need to be used between the first and second thin films. By using a first number equal to five or more, in other words by introducing mechanically dummy solder bumps, a better alignment of the functional layers 14,15 will be achieved. A 'symmetrical' pattern of solder bumps generally provides a good alignment in all 'directions'. Similarly, the second number of solder bumps 9,10 is preferably larger than a number of corners of the first substrate 4 and the third number of solder bumps 11,12 is preferably larger than a number of corners of the second substrate 5.

The first number of solder bumps 7,8 is preferably larger than a number of different first electrical signals to be exchanged between the first and second functional layers

14,15. Usually, the number of different first electrical signals to be exchanged between the first and second functional layers 14,15 comprises a ground signal, a supply signal and one or more electrical sensor signals. Then, for realizing electrical communication, this number of solder bumps would need to be used between the first and second functional layers 14,15. By using a first number larger than this number, in other words by introducing electrically dummy solder bumps, a better alignment of the functional layers 14,15 will be achieved. Similarly, the second number of solder bumps 9,10 is preferably larger than a number of different second electrical signals to be exchanged between the first and third functional layers 14,16 and the third number of solder bumps 11,12 is preferably larger than a number of different third electrical signals to be exchanged between the second and third functional layers 15,16.

So, by increasing the number of solder bumps, preferably in a symmetrical pattern, the alignment of the functional layers is increased, but the efficiency of the effective use of the chip area is decreased, and the costs are increased. Therefore, an optimum is to be found. This optimum depends on the alignment requirements and/or the effective use requirements and/or the costs.

In FIG. 4, the third substrate 6 is a carrier for the first and second substrates 4,5. In FIG. 3, one of the first and second substrates 4,5 is a carrier for the other one. Two substrates 4,5,6 are mounted on each other using a flip-chip technique based on a soldering bump process common in the art.

Figure 5:
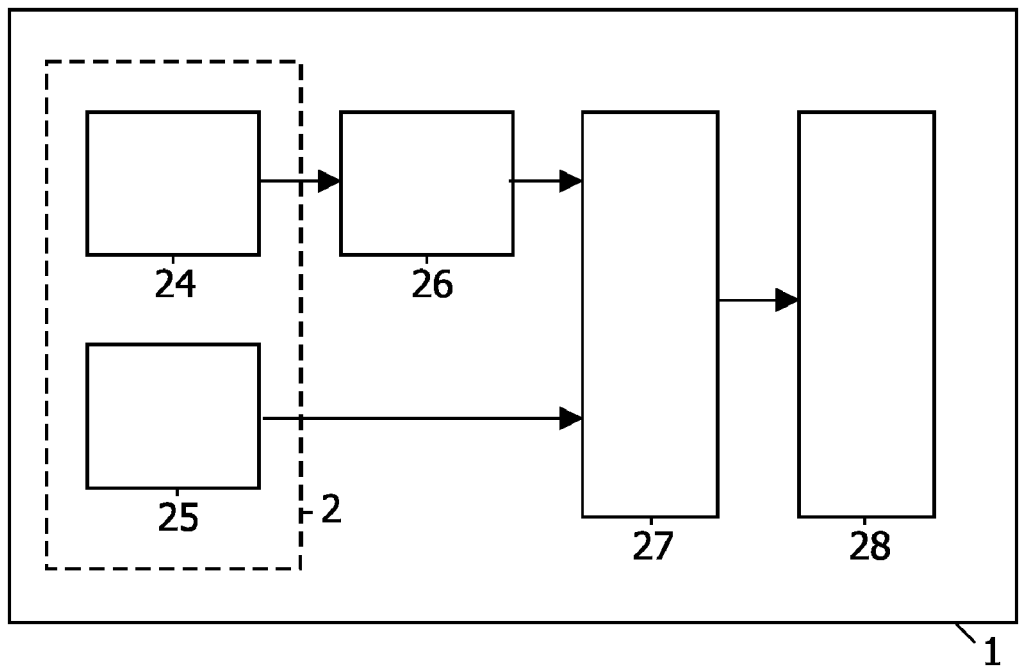
FIG. 5 shows diagrammatically a first embodiment of a device according to the invention.

The first embodiment of the device according to the invention shown diagrammatically in FIG. 5 discloses a device 1 comprising a sensor module 2. The sensor module 2 comprises a first sensor 24 for example realized in the first functional layer 14 through e.g. CMOS or thin film integration technology common in the art and comprises a second sensor 25 for example realized in the second functional layer 15 through e.g. CMOS or thin film integration technology common in the art. The first sensor 24 is coupled via first processing circuitry 26 to second processing circuitry 27, and the second sensor 25 is coupled directly to the second processing circuitry 27. The second processing circuitry 27 is further coupled to man-machine-interface-circuitry 28 or mmi-circuitry 28. The first processing circuitry 26 for example comprises amplification circuitry and/or compensation circuitry and/or conversion circuitry, and the second processing circuitry 27 for example comprises calculating circuitry, without excluding further circuitry.

Figure 6:
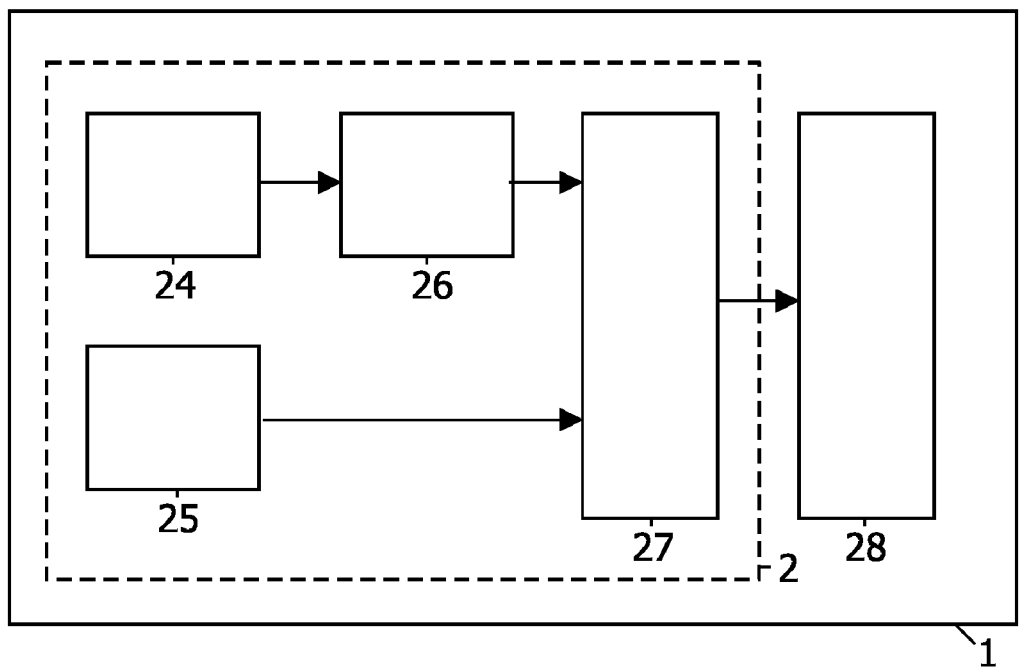
FIG. 6 shows diagrammatically a second embodiment of a device according to the invention.

The second embodiment of the device according to the invention shown diagrammatically in FIG. 6 discloses a device 1 comprising a sensor module 2 similar to the ones shown in FIG. 5 apart from the fact that the sensor module 2 now further comprises the circuitry 26,27. Thereto, this circuitry 26,27 is for example realized in the first and/or second and/or third functional layers 14,15,16 through e.g. CMOS or thin film integration technology common in the art.

Any of the sensors (24,25) may comprise a magnetic field sensor, electrical field sensor or gravitational field sensor. The sensor comprises an at-least one-dimensional sensor for sensing a field. Examples of sensors include magneto resistive sensors, Hall-effect sensors, accelerometers, gyroscopes, etc.

The first sensor 24 for example comprises a first magnetometer realized via magneto resistive elements common in the art and the second sensor 25 for example comprises a second magnetometer realized via magneto resistive elements common in the art, without excluding further combinations and realizations.

The first sensor 24 for example comprises an at least one-dimensional sensor for sensing a field in at least one direction and realized via magneto resistive elements common in the art and the second sensor for example comprises an at least one-dimensional sensor for sensing a field in at least one direction and realized via magneto resistive elements common in the art, without excluding further combinations and realizations. Both sensors can be functionally aligned under 90 degrees (in-plane) to one another.

An exemplarily mounting accuracy of both sensors of 0.1 degree may be obtained with a fairly low number of solder bumps. Hence, only a few dummy solder bumps may be added to the mechanically or electrically active ones.

The first sensor 24 for example comprises a first magnetometer realized via magneto resistive elements common in the art and the second sensor 25 for example comprises a second magnetometer realized via Hall-effect elements common in the art, without excluding further combinations and realizations.

The first sensor 24 for example comprises an at least one-dimensional sensor for sensing a field in at least one direction and realized via magneto resistive elements common in the art and the second sensor for example comprises an at least one-dimensional sensor for sensing a field in at least one direction and realized via Hall-effect elements common in the art, without excluding further combinations and realizations. Both sensors can be functionally aligned under 90 degrees (out-of-plane) to one another.

An exemplarily mounting accuracy of both sensors of 0.1 degree may be obtained with a fairly low number of solder bumps. Hence, only a few dummy solder bumps may be added to the mechanically or electrically active ones.

The first sensor 24 for example comprises a magnetometer realized via magneto resistive elements common in the art and the second sensor 25 for example comprises an accelerometer realized via micro-electromechanical system (MEMS) technology common in the art, without excluding further combinations and realizations.

The first sensor 24 for example comprises an at least two-dimensional sensor for sensing a field in at least two directions and realized via magneto resistive elements common in the art and the second sensor for example comprises an at least two-dimensional sensor for sensing a field in at least two directions and realized via a micro-electromechanical system (MEMS) technology common in the art, without excluding further combinations and realizations.

An exemplarily mounting accuracy of both sensors of 0.1 degree may be obtained with a fairly low number of solder bumps. Hence, only a few dummy solder bumps may be added to the mechanically or electrically active ones. In fact, the alignment resulting from using the inventive method will be sufficiently good so that the coordinate frames of both sensors can be treated as a single, common coordinate frame for calibration and application purpose. As a matter of fact, there is no need to calibrate the misalignment between the coordinate frames of both sensors. Hence complexity is reduced, resulting in a cost-effective and compact sensor module.

The functional layer may include any dedicated sensor technology and may include the term 'thin film' in a non-restrictive way. Devices that are made in a CMOS process, e.g. Hall sensors are also included. The functional layer can include the active part of the Si wafer (CMOS front end=transistors) as well as the CMOS backend (e.g. a lot of accelerometers are fabricated in a CMOS backend-like technology for compatibility reasons).

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. Use of the verb "to comprise" and its conjugations does not exclude the presence of elements or steps other than those stated in a claim. The article "a" or "an" preceding an element does not exclude the presence of a plurality of such elements. In the device claim enumerating several means, several of these means may be embodied by one and the same item of hardware. The mere fact that certain measures are recited in mutually different dependent claims does not indicate that a combination of these measures cannot be used advantageously.

The invention claimed is:

1. A device comprising a sensor module, the sensor module comprising a package, the package comprising:
    a first substrate with a first functional layer;
    a second substrate with a second functional layer, wherein the second functional layer is opposite the first functional layer;
    at least one sensor located in at least one of the functional layers; and
    a system comprising solder bumps that align the first and second functional layers, wherein at least some of the solder bumps are dummy solder bumps.

2. The device according to claim 1, the system further comprising:
    a first number of solder bumps for coupling the functional layers electrically and mechanically to each other via first bonding elements.

3. The device according to claim 2, the first number of solder bumps being larger than a number of corners of the first or second substrate.

4. The device according to claim 2, the first number of solder bumps being larger than a number of different first electrical connections between the first and second functional layers.

5. The device according to claim 1, the system further comprising:
    a third substrate with a third functional layer and a second number of solder bumps for coupling the first and third functional layers electrically and mechanically to each other via second bonding elements and a third number of solder bumps for coupling the second and third functional layers electrically and mechanically to each other via third bonding elements.

6. The device according to claim 5, the second number of solder bumps being larger than a number of corners of the first substrate and the third number of solder bumps being larger than a number of corners of the second substrate.

7. The device according to claim 5, the second number of solder bumps being larger than a number of different second electrical connections between the first and third functional layers and the third number of solder bumps being larger than a number of different third electrical connections between the second and third functional layers.

8. The device according to claim 1, the at least one sensor further comprising:
    a magnetometer.

9. The device according to claim 1, the at least one sensor further comprising:
    at least a one-dimensional sensor for sensing a field in at least one direction.

10. The device according to claim 1, the at least one sensor further comprising:
    a first sensor comprising a magnetometers; and
    a second sensor comprising another magnetometer.

11. The device according to claim 1, the at least one sensor further comprising
    a first sensor comprising an at least one-dimensional sensor for sensing a field in at least one direction; and
    a second sensor comprising an at least one-dimensional sensor for sensing a field in at least one direction.

12. The device according to claim 1, the at least one sensor further comprising:
    a first sensor comprising a magnetometer; and
    a second sensor comprising an accelerometer.

13. The device according to claim 1, the at least one sensor further comprising:
    a first sensor comprising an at least two-dimensional sensor for sensing a field in at least two directions; and
    a second sensor comprising an at least two-dimensional sensor for sensing a field in at least two directions.

14. The device according to claim 1, the at least one functional layer further comprising:
    circuitry for processing electrical sensor signals originating from the at least one sensor.

15. A sensor module comprising a package, the package comprising:
    a first substrate with a first functional layer;
    a second substrate with a second functional layer, wherein the second functional layer is opposite the first functional layer;
    at least one sensor located in at least one of the functional layers; and
    a system comprising solder bumps for aligning the first and second functional layers, wherein at least some of the solder bumps are dummy solder bumps.

16. The sensor module of claim 15, wherein the solder bumps directly align the first functional layer to the second functional layer.

17. The sensor module of claim 15, wherein the solder bumps indirectly align the first functional layer to the second functional layer via a third functional layer.

18. The sensor module of claim 15, wherein the solder bumps provide alignment for displacement in the XY plane, rotation in the XY plane, and out-of-plane rotation.

19. A method for producing a sensor module comprising a package, the method comprising the step of aligning a first functional layer at a first substrate and a second functional layer at a second substrate via solder bumps, wherein at least some of the solder bumps are dummy solder bumps, at least one of the functional layers comprising at least one sensor, and the second functional layer is opposite the first functional layer.

20. A method for producing a device comprising a sensor module, the sensor module comprising a package, the package comprising:
    a first substrate with a first functional layer;
    a second substrate with a second functional layer, wherein the second functional layer is opposite the first functional layer;
    at least one sensor located in at least one of the functional layers; and
    a system comprising solder bumps for aligning the first and second functional layers, wherein at least some of the solder bumps are dummy solder bumps, the method comprising
    the step of coupling the sensor module to the device.

* * * * *